United States Patent [19]
Yamagishi et al.

[11] Patent Number: 5,420,873
[45] Date of Patent: * May 30, 1995

[54] APPARATUS FOR DECODING BCH CODE FOR CORRECTING COMPLEX ERROR

[75] Inventors: Atsuhiro Yamagishi; Touru Inoue; Tokumichi Murakami; Kohtaro Asai, all of Kanagawa, Japan

[73] Assignee: Mitsubishi Denki Kabushiki Kaisha, Tokyo, Japan

[*] Notice: The portion of the term of this patent subsequent to Jan. 12, 2010 has been disclaimed.

[21] Appl. No.: 844,159

[22] Filed: Apr. 6, 1992

Related U.S. Application Data

[63] Continuation of Ser. No. 445,174, Dec. 4, 1989.

[51] Int. Cl.$^6$ .............. G11C 29/00; H03M 13/00; G06F 11/10
[52] U.S. Cl. .............. 371/38.1; 371/39.1; 371/44
[58] Field of Search .............. 371/38.1, 41, 37.1, 371/39.1, 43, 45, 44

[56] References Cited

U.S. PATENT DOCUMENTS

| | | | |
|---|---|---|---|
| 3,544,963 | 12/1970 | Tong | 371/38.1 |
| 4,291,406 | 9/1981 | Bahl et al. | 371/44 |
| 4,397,022 | 8/1983 | Weng et al. | 371/37.1 |
| 4,592,054 | 5/1986 | Namekawa et al. | 371/38.1 |
| 4,661,956 | 4/1987 | Izumita et al. | 371/38 |
| 4,868,828 | 9/1989 | Shao et al. | 371/39.1 |
| 4,916,702 | 4/1990 | Berlekamp | 371/39.1 |
| 5,099,482 | 3/1992 | Cameron | 371/37.1 |
| 5,179,560 | 1/1993 | Yamagishi et al. | 371/38.1 |

FOREIGN PATENT DOCUMENTS 2131253 6/1984 United Kingdom .
2136248 9/1984 United Kingdom .

OTHER PUBLICATIONS

S. Lin, D. J. Costello, Jr., "Error Control Coding: Fundamentals and Applications", Prentice Hall, Inc., pp. 280-282, 257-269, 1983.

Primary Examiner—Robert W. Beausoliel, Jr.
Assistant Examiner—Trinh L. Tu
Attorney, Agent, or Firm—Wolf, Greenfield & Sacks

[57] ABSTRACT

An apparatus for decoding a received BCH code signal for correcting a combined complex error is disclosed which includes a syndrome generating circuit for generating two n-bit syndromes corresponding to the received signal, a syndrome converting circuit for converting the two n-bit syndromes to a 2n-bit syndrome, a random error correcting circuit, a burst error correcting circuit, two combining circuits and output selecting circuit. The random error correcting circuit inputs the two n-bit syndromes and outputs a random error correction signal to one of the combining circuits and the burst error correcting circuit inputs the 2n-bit syndrome and outputs a burst error correction signal to the other of the combining circuits. The combining circuits combine the correction signals to the received BCH code signal. The output selecting circuit selectively outputs one of the combined signals from the combining circuits in accordance with the decoding conditions of the error correcting circuits and the result of comparison between the decoded and error-corrected signals from the combining circuits.

22 Claims, 5 Drawing Sheets

Fig. 6

| | | RANDOM ERROR CORRECTING CIRCUIT | |
| --- | --- | --- | --- |
| | | CORRECTION | ERROR DETECTION |
| BURST ERROR CORRECTING CIRCUIT | CORRECTION | ALL THE BIT PATTERNS AFTER CORRECTION ARE IDENTICAL → RIGHTLY CORRECTED <br><br> THE PATTERNS AFTER CORRECTION ARE NOT IDENTICAL → UNCORRECTABLE ERROR DETECTED | EMPLOY OUTPUT OF BURST ERROR CORRECTING CIRCUIT |
| | ERROR DETECTION | EMPLOY OUTPUT OF RANDOM ERROR CORRECTING CIRCUIT | UNCORRECTABLE ERROR DETECTED |

APPARATUS FOR DECODING BCH CODE FOR CORRECTING COMPLEX ERROR

This application is a continuation of application Ser. No. 07/445,174, filed Dec. 4, 1989.

BACKGROUND OF THE INVENTION

1. Field of the Invention

The present invention relates to an error correction apparatus in a digital communication system using a BCH (Bose-Chandhuri-Hocqueghem) code, more particularly relates to a BCH code decoding apparatus for correcting a complex error in a digital communication system.

2. Description of the Prior Art

FIG. 1 is a block diagram showing a conventional combined-error-correcting circuit for correcting both random and burst errors, as described, for example, in "Error Control Coding: Fundamentals and Applications" by S. LIN and D. J. COSTELLO, Jr., pp. 280–282, published by Prentice-Hall, Inc., 1988. In the figure, numeral 1 is an input terminal for inputting a received coded message, 39 is a burst-error-correcting unit for correcting a burst error by burst trapping, 40 is a random-error-correcting unit for correcting a random error, 6 is an output selecting circuit for selecting either the output from the burst-error-correcting unit 39 or the output from the random-error-correcting unit 40 and 9 is an output terminal for outputting an decoded result.

The operation of the above-mentioned prior art will now be described. A received message which has been decoded at a transmitter site before transmitting and includes errors added in the communication path is input from the input terminal 1 into both the burst-error-correcting unit 39 and the random-error-correcting unit 40. The message is decoded by the respective correcting units, and either the decoded output from the burst-error-correcting unit 39 or the decoded output from the random-error-correcting unit 40 is selected by the output selecting circuit 6 in response to the condition of the communication path, and thereby the selected output is delivered from the output terminal 9 as an output of the complex error correcting circuit.

Since conventional complex error correcting circuits are generally arranged as described above, it is necessary to control the output selecting circuit 6 in response to the condition of the communication path with respect to the concrete error correcting code, but there is shown no definite suggestion as to how the condition of the communication path can be concretely grasped and there is also shown no criterion to appropriately judge such a condition, therefore it is difficult to accurately control the selecting circuit 6. There is a further problem that, because of the burst error correcting unit and the random error correcting unit being independently arranged from each other, it is necessary that the respective units independently include syndrome generating circuits for extracting the error condition.

SUMMARY OF THE INVENTION

It is an object of the present invention to solve such problems as described above and to obtain an apparatus for decoding a BCH code signal and for correcting a complex error combined in the BCH code signal which is capable of grasping the condition of the communication path, concretely providing a criterion for judging the condition of the communication path and commonly using a syndrome generating circuit for a burst error correcting unit and a random error correcting unit.

This object is achieved by an apparatus for decoding a BCH code used for correcting a complex error which is capable of grasping the condition of a communication path by using the decoded result of a burst error correcting unit with a burst trapping function as well as the decoded result of the random error correcting unit having a circuit for deciding the result of an operation with a circuit for making an operation of integers of modulo $2^n - 1$, thereby concretely providing a criterion for judging the condition of the communication path to control an output selecting circuit and there being further provided a means for converting a syndrome, thereby the common use of a syndrome generating circuit can be attained.

BRIEF DESCRIPTION OF THE DRAWINGS

FIG. 6 is a table showing the criterion for controlling the output selecting switch incorporated in the output selection control circuit shown in FIG. 5.

DETAILED DESCRIPTION OF THE PREFERRED EMBODIMENTS

Figure 1:
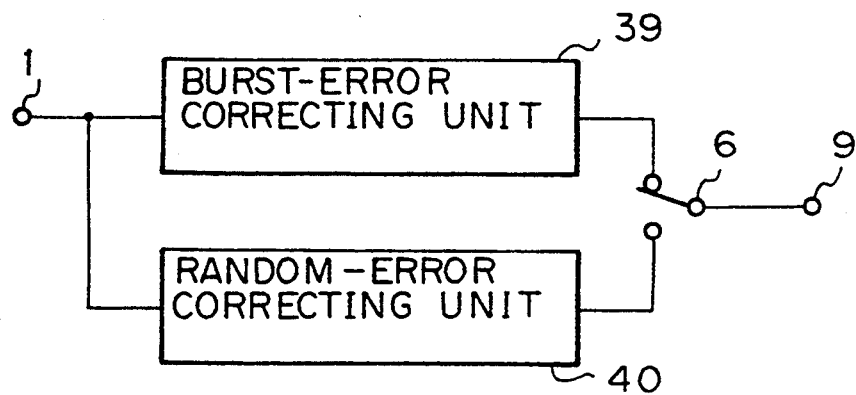
FIG. 1 illustrates a block diagram showing a conventional apparatus for decoding a BCH code with a correction function of complex error.
Figure 2:
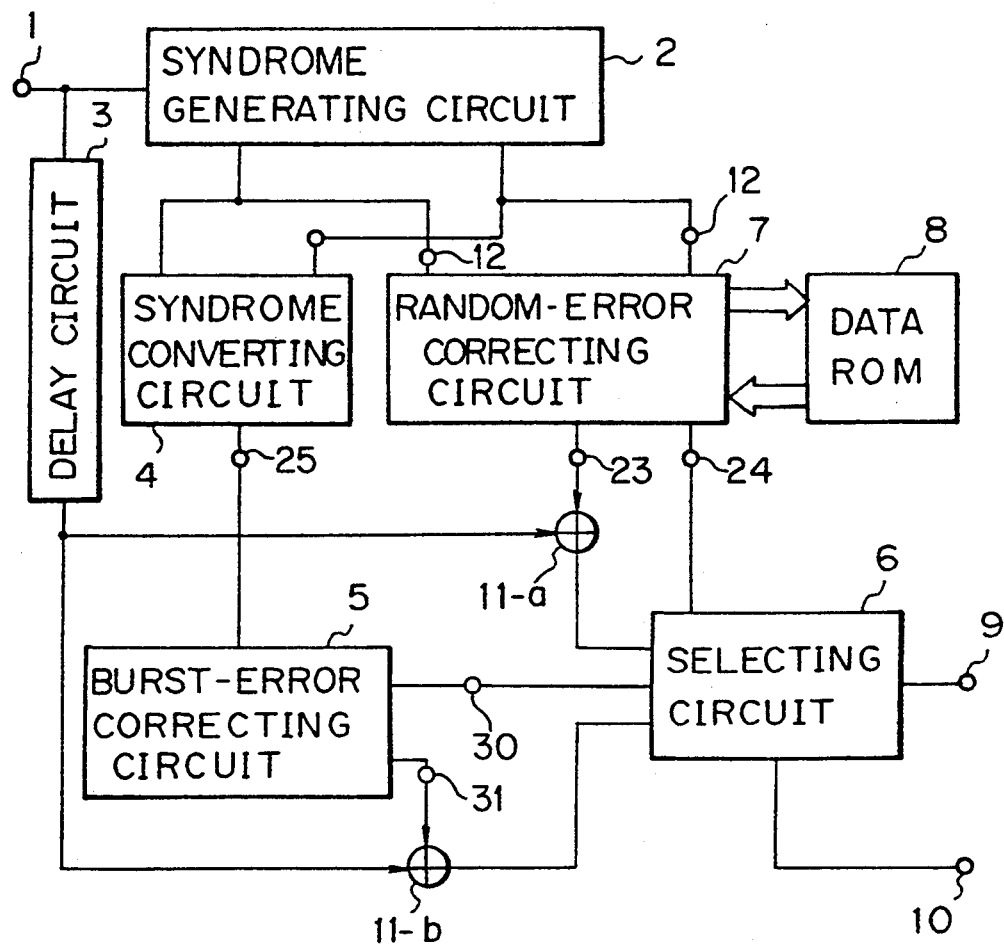
FIG. 2 is a block diagram showing an apparatus for decoding a BCH code with a correction function of a complex error according to this invention.
Figure 3:
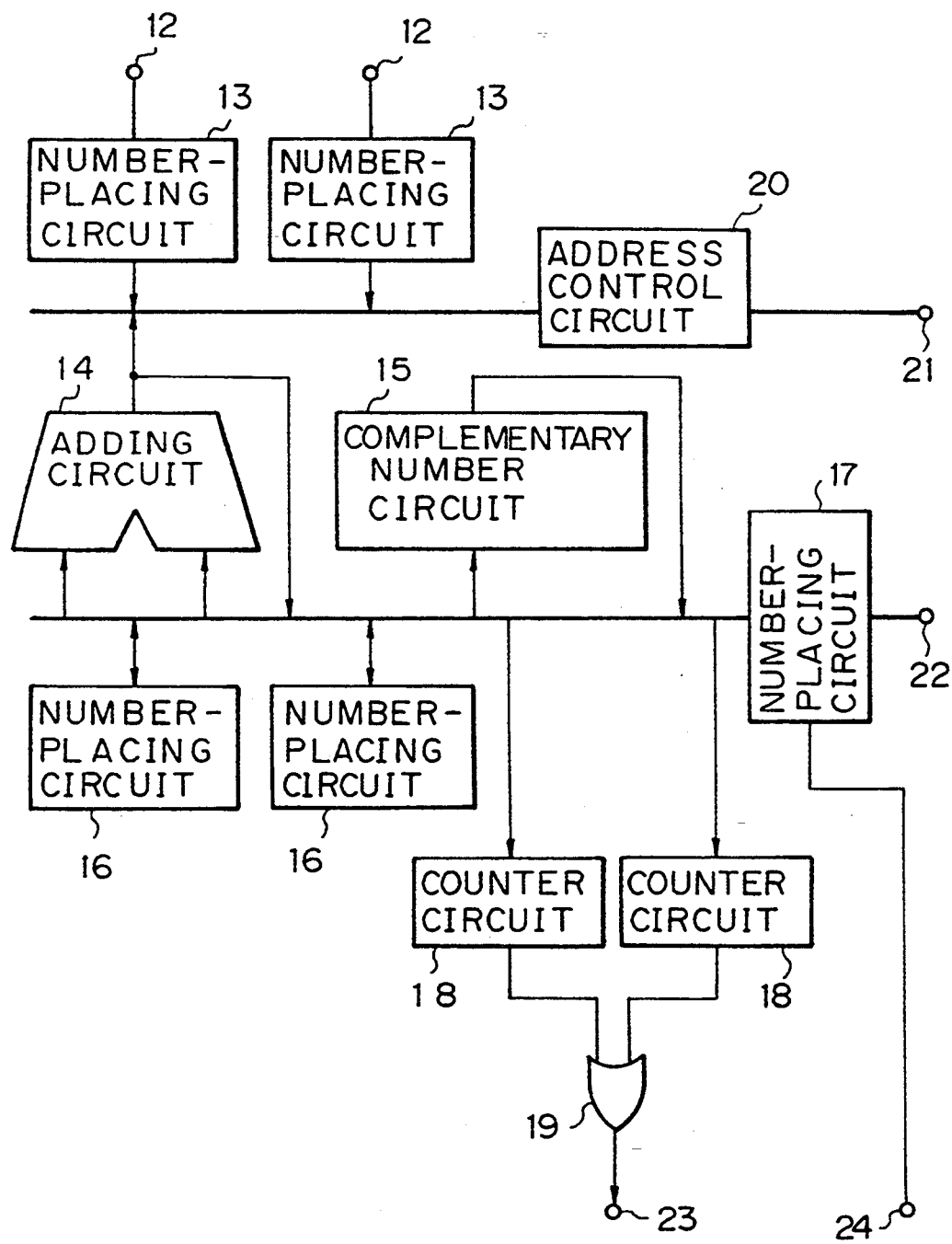
FIG. 3 is a block diagram showing details of the random error correcting circuit shown in FIG. 2.

An embodiment of the present invention will now be described. Referring now to FIG. 2, there is shown in block diagram form a error correcting unit. In the drawing, numeral 1 denotes an input terminal for inputting a coded message received; 2, a syndrome generating circuit for generating two n-bit syndromes for correcting a random error; 3, a delay circuit for holding the received message during the period of generating the syndromes and correcting an error; 4, a syndrome converting circuit for performing a conversion from the two n-bit syndromes generated in the syndrome generating circuit 2 to a 2n-bit syndrome for a burst trapping circuit for correcting a burst error correcting; 5, a burst error correcting circuit for calculating the position in which a burst error is generated, and the pattern of the burst error; 6, an output selecting circuit incorporating a criterion for grasping and judging the condition of a communication path by using the decoded results of the burst error correcting circuit 5 and a random error correcting circuit mentioned next; 7, a random error correcting circuit for receiving as an input, the syndrome which is vector expressed by the polynomial basis in a finite field and obtained with the syndrome generating circuit 2, converting the syndrome vector-expressed syndrome to an exponential expression of a primitive element of the finite field, obtaining an error position polynomial by normalizing the converted exponential repression with an integer operation of modulo $2^n - 1$, obtaining the radical of the normalized error position polynomial by looking up a table of the normalized error position pre-calculated the constant terms of the normalized error position polynomial, calculating the true error position from the normalized error position, and correcting the random error; 8, a data ROM for storing data for converting the syndrome vector-expressed by the polynomial basis in the finite field obtained by the syndrome generating circuit 2 into the exponential expression of the primitive element of the finite field and data of the normalized error position which is the radical of the normalized error position polynomial; 9, an output terminal for outputting the decoded results; 10, a terminal for outputting a signal when an uncorrectable error showing the final decoded condition is detected; and 11-a and 11-b, exclusive OR circuits for adding error correction pulses output from the burst error and random error correcting circuits 5 and 7 to the received message.

FIG. 8 shows the details of the random error correcting circuit 7 shown in FIG. 2, and in this figure, numeral 12 is an input terminal for inputting the syndrome vector-expressed with the polynomial basis in the finite field obtained by the syndrome generating circuit 2 shown in FIG. 2, 13 a register for holding the input syndrome, 14 an adding circuit with modulo $2^n - 1$, 15 a complementary number circuit with modulo $2^n - 1$, 16 a register for temporarily holding data, $2^n - 1$, a register having a function for checking the results of calculation by the adding circuit 14 with modulo $2^n - 1$ and the complementary number circuit 15 with modulo $2^n - 1$, 18 counter circuits for calculating the true error position, 19 an OR circuit for mixing the correction pulses output from the counter circuits 18 and 18, 20 an address control circuit for outputting an address to the data ROM 8 which stores the data for converting the syndrome vector-expressed with the polynomial basis in the finite field to the exponential expression of the primitive element of the finite field and the data of the normalized error position which is a radical of the normalized error position polynomial, 17 a register which receives the output of data ROM 8 and compares it to $2^n - 1$. If the output of ROM 8 is equal to $2^n - 1$, this indicates an uncorrectable error 21 an address terminal for outputting and address to the data ROM 8, 22 a data input terminal to which data are inputted from the data ROM 8, 23 an output terminal for outputting the correction pulse, and 24 a terminal for outputting an uncorrectable error detection signal when an error can not be corrected by the random error correcting circuit 7.

Figure 4:
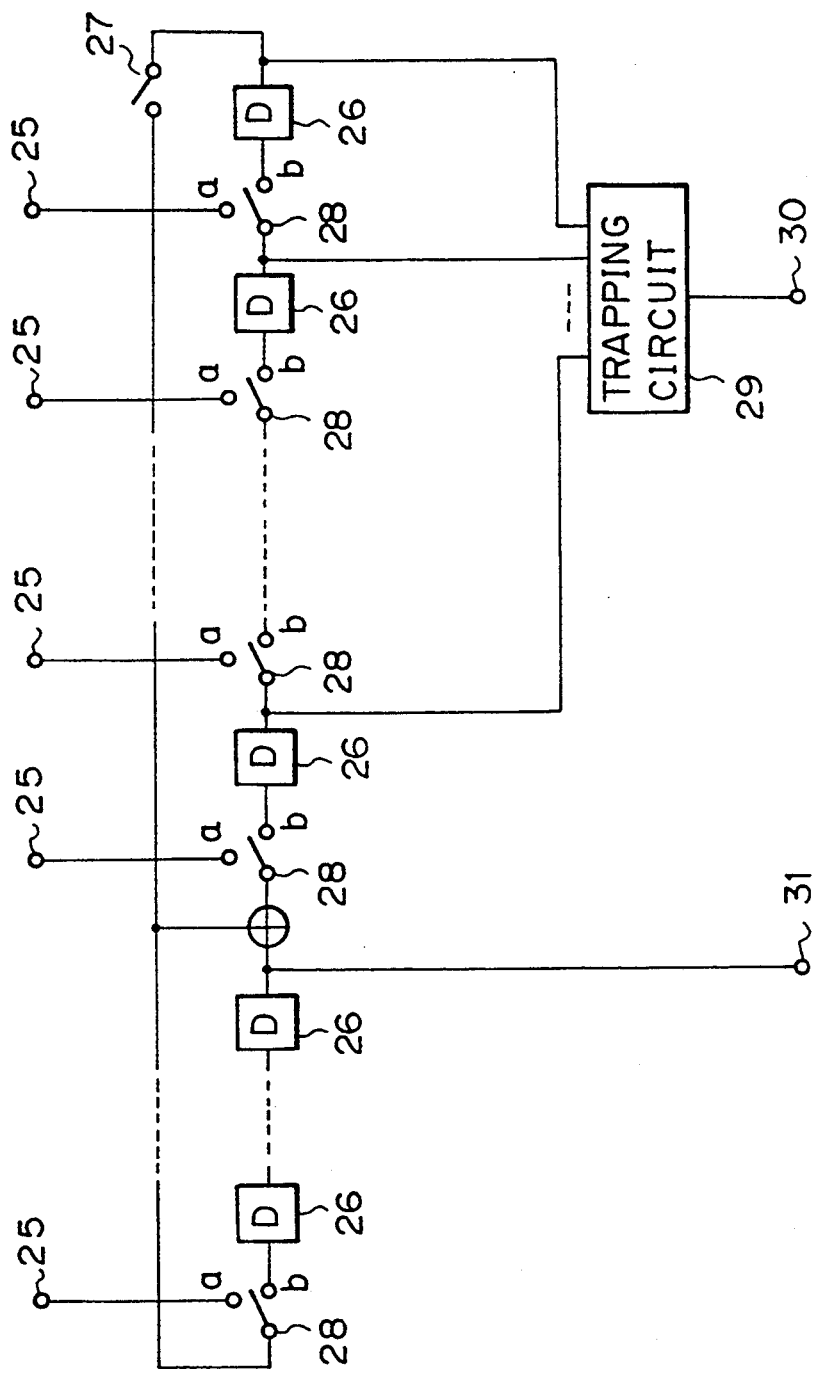
FIG. 4 is a detailed diagram of the burst error correcting circuit shown in FIG. 2.

FIG. 4 shows the details of the burst error correcting circuit 5 shown in FIG. 2 in which numeral 25 is an input terminal for inputting the output of the syndrome converting circuit 4 illustrated in FIG. 2, 26 a 1-bit delay circuit, 27 a switch for controlling a feedback circuit consisting of the delay circuits 28 connected in loop through the switch, 28 a selecting switch for selecting either the output from the syndrome converting circuit 4 or the data from the feedback circuit, 29 a trapping (zero detection) circuit for detecting the fact that the upper $(2n - b)$-bits of the linear feedback shift register, of the feedback circuit having $2n$-bits in length become zero, 30 a terminal outputting an uncorrectable burst error detection signal when an error which can not be corrected by the burst error correcting circuit 5 is detected, and 31 an error-pattern output terminal for serially outputting an error-pattern to be corrected when the burst error is corrected.

Figure 5:
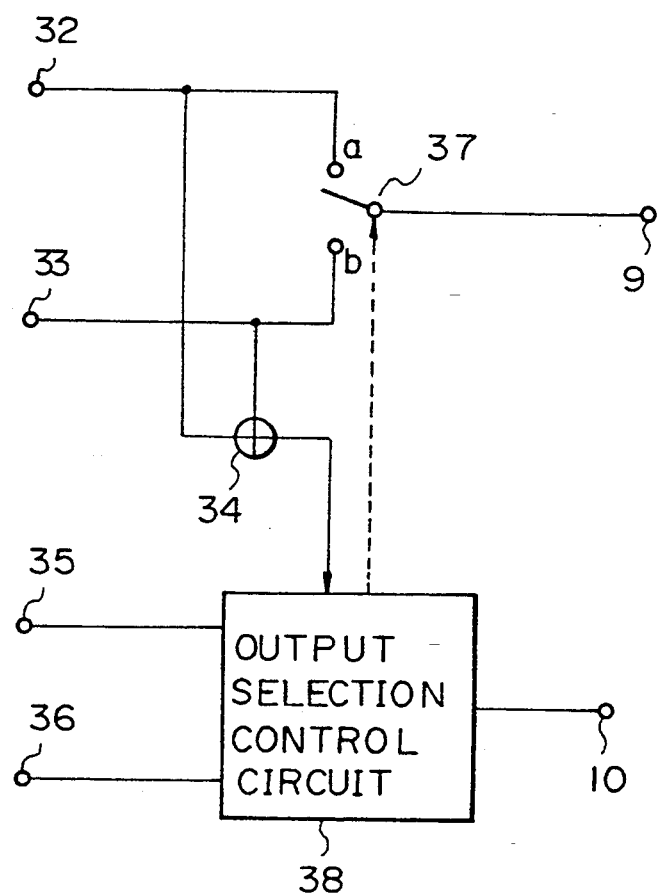
FIG. 5 shows a detailed diagram of the output selecting circuit illustrated in FIG. 2.

FIG. 5 is a detailed block diagram of the output selecting circuit 6 shown in FIG. 2 including the criterion for grasping and judging the condition of the communication path by using the decoded results of the burst error and random error correcting circuits 5 and 7 shown in FIG. 2. In FIG. 5, numeral 32 denotes an input terminal for the data which has been corrected by using the output from the random error correcting circuit 7, 33 an input terminal for data which has been corrected by using the output from the burst error correcting circuit 5, 34 an exclusive OR circuit for comparing the data corrected by the random error correcting circuit 7 and the data corrected by the burst error correcting circuit 5, 85 an input terminal of the uncorrectable error detection signal from the terminal 24 related to the random error correcting circuit 7, 36 an input terminal of the uncorrectable error detection signal from the terminal 31 related to the burst error correcting circuit 5, 37 an output selecting switch for selecting either the data corrected by the random error correcting circuit 7 or the data corrected by the burst error correcting circuit 5, and 38 an output selection control circuit for generating an uncorrectable signal to the terminal 10 (shown in FIGS. 2 and 4) depending on the uncorrectable error detection signals input from the random and burst error correcting circuits 7 and 5 to the input terminals 35 and 36, and the generating a control signal or controlling the output selecting switch 37 in accordance with the error detection signals and the output signal from the exclusive OR circuit 34 which compares the data input to the terminal 32, which has been corrected by the random error correcting circuit 7 and the data input to the terminal 33, which has been corrected by the burst error correcting circuit 5.

FIG. 6 is a table showing the criterion for controlling the output selecting switch 37 incorporated in the selecting circuit 6 and the criterion for deciding the uncorrectable error signal to the terminal 10.

The operation will now be described. A message which has been coded at a transmitter side and includes errors added at the communication path is received at the input terminal 1. Two n-bit syndromes $S_1$, $S_3$ expressed by vectors of the polynomial basis in the finite field generated by the syndrome generating circuit 2. The two n-bit syndromes $S_1$, $S_3$ are then input to the random error correcting circuit 7 and the syndrome converting circuit 4. In the random error correcting circuit 7, the input syndromes $S_1$, $S_3$ are held in the register 13 and output as address of the data ROM 8 through the address control circuit 20 to the address output terminal 21. The syndromes $S_1$, $S_3$ are converted by the data ROM 8 from the vector expression with the polynomial basis in the finite field to the exponential expression of primitive element of finite field, log $S_1$ and log $S_3$. The converted syndromes log $S_1$ and log $S_3$, are stored into the register 16 by way of the data input terminal 22 and the register 17. Based on the exponentially expressed syndromes log $S_1$ and log $S_3$ stored in the register 16, the constant term (log $S_3 - 3 \times$ log $S_1$) of the normalized error position polynomial is calculated using the adding circuit 14 and the complementary number circuit 15, and the constant term (log $S_3 - 3 \times$ log $S_1$) is then output as address of the data ROM 8 through the address control circuit 20 and, the address output terminal 21. The constant term (log $S_3 - 3 \times$ log $S_1$) is then converted by the data ROM 8 to two roots $i = $ log $\alpha^i$ and $j = $ log $\alpha^j$ of the normalized error position polynomial. $\alpha$ is a primitive element of a finite field and $\alpha^i$ and $\alpha^j$ are radicals of the normalized error position polynomial, i.e. they are represented the normalized error position. The two radicals $i = $ log $\alpha^i$ and $j = $ log $\alpha^j$ of the error position polynomial normalized by the data ROM 8 are directed through the data input terminal 22 and the register 17 and added by the adding circuit 14 with log $S_1$ and stored in the counter circuit 18 for calculating the true error position. At this time, the result of addition is checked by the register 17, and if it is in an uncorrectable condition, an uncorrectable error detection signal is output to the terminal 24. The true error position stored in the counter circuit 18 is counted down, and when the content of the counter circuit 18 becomes zero, an error correction pulse is given through the OR circuit 19 to the exclusive OR circuit 11-a.

On the other hand, the two n-bit syndromes $S_1$ and $S_3$ input into the syndrome converting circuit 4 are converted to 2n-bit syndromes and thereafter input to the burst error correcting circuit 5. For example, for (511,493) BCH codes having the generated polynomial of:

$$g(x) = X^{18} + X^{15} + X^{12} + X^{10} + X^8 + X^7 + X^6 + X^3 + 1$$

the conversion is performed in accordance with the following equations:

$SI_0 = S_{17} + S_{14} + S_{13} + S_{11} + S_{10} + S_{37} + S_{34} + S_{33} + S_{31}$ $SI_1 = S_{18} + S_{15} + S_{14} + S_{12} + S_{11} + S_{10} + S_{38} + S_{35} + S_{34} + S_{31} + S_{30}$ $SI_2 = S_{16} + S_{15} + S_{13} + S_{12} + S_{11} + S_{10} + S_{36} + S_{35} + S_{33} + S_{31} + S_{30}$ $SI_3 = S_{16} + S_{12} + S_{36} + S_{33} + S_{32}$ $SI_4 = S_{17} + S_{13} + S_{37} + S_{34} + S_{33}$ $SI_5 = S_{18} + S_{14} + S_{10} + S_{38} + S_{35} + S_{34} + S_{30}$ $SI_6 = S_{17} + S_{15} + S_{14} + S_{13} + S_{37} + S_{36} + S_{35} + S_{34} + S_{33}$ $SI_7 = S_{18} + S_{17} + S_{16} + S_{15} + S_{13} + S_{11} + S_{38} + S_{36} + S_{35} + S_{33} + S_{31}$ $SI_8 = S_{18} + S_{16} + S_{13} + S_{12}S_{11} + S_{10} + S_{36} + S_{33} + S_{32} + S_{31} + S_{30}$ $SI_9 = S_{17} + S_{14} + S_{13} + S_{12} + S_{11} + S_{37} + S_{34} + S_{33} + S_{32} + S_{31}$ $SI_{10} = S_{18} + S_{17} + S_{15} + S_{12} + S_{11} + S_{38} + S_{37} + S_{35} + S_{32} + S_{31}$ $SI_{11} = S_{18} + S_{16} + S_{13} + S_{12} + S_{10} + S_{38} + S_{36} + S_{33} + S_{32} + S_{30}$ $SI_{12} = S_{10} + S_{30}$ $SI_{13} = S_{11} + S_{31}$ $SI_{14} = S_{12} + S_{32}$ $SI_{15} = S_{17} + S_{14} + S_{11} + S_{10} + S_{37} + S_{34} + S_{31} + S_{30}$ $SI_{16} = S_{18} + S_{15} + S_{12} + S_{11} + S_{38} + S_{35} + S_{32} + S_{31}$ $SI_{17} = S_{16} + S_{13} + S_{12} + S_{10} + S_{36} + S_{33} + S_{32} + S_{30}$

In the burst error correcting circuit 5, the switch 27 for controlling the feedback is closed and the selecting switches 28 are turned to the sides "a" connected to the input terminals 25 so that the two n-bit syndromes converted by the syndrome converting circuit 4 are inputted to the delay circuit 26 of the linear feedback shift register circuit having 2n-bit in length. The selecting switch 28 is then turned to the linear feedback shift register circuit sides "b" and the burst error pattern is checked by the trapping (zero detection) circuit 29 while performing the shifting operation. If the burst error pattern is detected by the trapping (zero detection) circuit 29, the switch 27 is opened and the error pattern is serially output from the error pattern output terminal 81 to the exclusive OR circuit 11-b. At this time, if no error pattern is detected by the shifting operation throughout the code length, the signal of uncorrectable error detected by the trapping (zero detection) circuit 29 is output to the terminal 80.

If an error pattern is detected at the random error correcting circuit 7 or the burst error correcting circuit 5, the received message is read out from the delay circuit 3 in which the received message has been held, the respective error patterns detected at the random and burst error correcting circuits 7 and 5 are separately combined to the received message by the exclusive OR circuits 11-a, 11-a, and thus the random and burst errors are corrected to provide their decoded messages. Thereafter, the decoded messages corrected by the random error and burst error correcting circuits 7 and 5 and the outputs from the uncorrectable error detection terminals 24, 30 connected to the random error and burst error correcting circuits 7 and 5 are input to the output selecting circuit 6. In the output selecting circuit 6, the respective messages input from the random error and burst error correcting circuits 7 and 5 are compared by the exclusive OR circuit 34. The result of comparison by the exclusive OR circuit 34. The result of comparison error detection signals from the terminals 24, 30 are input to the output selection control circuit 38 which, in turn, controls the output selecting switch 37 in accordance with the criterion of output selection shown in FIG. 6. Thus, if both of the uncorrectable error detection signals from the terminals 24, 30 indicates correction and if the output of the exclusive OR circuit 34 which compares the respective decoded messages indicates that the decoded messages are identical, then the output selecting switch 37 is turned to its "a"-side to select the output of the random error correcting circuit 7 through the exclusive OR circuit 11-a, and if the uncorrectable error detection signal from the terminal 24 shows correction and the uncorrectable error detection signal from the terminal 30 detects an uncorrectable error, the output selecting switch 37 is turned to its "a"-side to select the same output as above, and if the uncorrectable error detection signal from the terminal 30 indicates correction and the uncorrectable error detection signal from the terminal 24 shows detection of any uncorrectable error, then the output selecting switch 37 is turned to its "b"-side to select the output of the burst error correcting circuit 5 through the exclusive OR circuit 11-b, and in other cases, the signal which represents the exist of an uncorrectable error is output at the terminal 10. The final decoded message selected by the output selecting circuit 6 is output through the output terminal 9.

In the above-described embodiment, the random error correction circuit 7 is provided with the circuit performing operation with modulo $2^n - 1$, but there may be provided a random error correcting circuit using a conventional linear period shift register circuit. Furthermore, the code length is not definitely limited, but it is a matter of course that a similar effect can also be brought forth with a shortened code.

As described above, according to the present invention, there can effectively be provided a higher reliable circuit for decoding a BCH code in order to correct a complex error by the provision of the output selecting circuit incorporating the criterion of selecting the outputs of the random error and burst error correcting circuits.

It is further understood by those skilled in the art that the foregoing description is a preferred embodiment of the disclosed device and that various changes and modifications may be made in the invention without departing from the spirit and scope thereof.

What is claimed is:

1. An apparatus for decoding a received BCH code signal for correcting a combined complex error, the apparatus comprising:
    a first unit for correcting a random error of said BCH code signal by using decoding means to produce a first decoded output signal and a first decoding condition signal;
    a second unit for correcting a burst error of said BCH code signal by using decoding means to produce a second decoded output signal and a second decoding condition signal, wherein a decoding condition signal relates to an indication of correctable or uncorrectable error detection by one of the first and second units; and
    a third unit connected to said first and second units for selecting one of the decoded output signals based on a combination of the first and second decoding condition signals and the first and second decoded output signals, said third unit including:
    means for receiving the decoded output signals from said first and second units,
    means for determining which output signal of said first and second units is to be selectively output,
    means for determining whether at least one of the first and second decoded output signals is a correctable error signal, and
    means for providing an uncorrectable error output signal in response to a determination that neither the first nor second decoded output signal is a correctable error signal.

2. An apparatus according to claim 1 wherein said first unit comprises:
    means for generating two n-bit syndromes in accordance with said received BCH code signal;
    random error correcting means for calculating a random error position of said received BCH code signal in accordance with said syndromes and for outputting a random error correction signal based on the random error position; and
    first combining means for combining said random error correction signal with said received BCH code signal and for outputting a random error corrected BCH code signal.

3. An apparatus according to claim 2 wherein said random error correction means comprises:
    means for converting patterns of said syndromes generated by said means for generating to an exponential expression with primitive elements;
    means for normalizing said converted exponential expression with an integer operation of modulo $2^n - 1$ so as to obtain an error position polynomial;
    means for looking up a table storing pre-calculated roots of said error position polynomial and for obtaining a normalized error position; and
    means for calculating said true random error position based on said obtained normalized error position to output said random error correction signal.

4. An apparatus according to claim 2, wherein said second unit comprises:
    means for converting said two n-bit syndromes generated by said generating means of said first means to 2n-bit syndrome;
    burst error correcting means for calculating a burst error position of said received BCH code signal in accordance with said 2n-bit syndrome and outputting a burst error correction signal; and
    second combining means for combining said burst error correction signal and said received BCH code signal, and for outputting a burst error corrected BCH code signal.

5. An apparatus according to claim 4, wherein said third unit comprises:
    switching means for selectively outputting one of the outputs from said first and second combining means;
    detecting means for detecting whether or not said outputs from said first and second combining means are the same and for providing a signal indicating whether said outputs are the same; and
    control means, connected to said first and second combining means of said first and second unit, respectively, and to said third detecting means, for outputting a switching control signal to said switching means in response to the signals from the first and second combining means, and the detecting means.

6. An apparatus according to claim 4, wherein said burst error correcting means comprises
    2n-bit linear feedback shift register means having a plurality of stages which receives said 2n-bit syndrome, and
    trapping detecting means coupled between at least some of the stages of the shift register means for detecting a burst error pattern of said registered 2n-bit syndrome by means of zero detection.

7. An apparatus according to claim 4 further comprising delay means for holding said received BCH code signal until said random and burst error correcting means output said random and burst error correction signals, and for thereafter outputting said received BCH code signal to said first and second combining means.

8. An apparatus according to claim 1 wherein said first unit comprises
    means for generating syndromes, and
    means for detecting uncorrectable errors in response to a combination of syndromes from the generating means and for providing the first decoding condition signal indicating whether there are uncorrectable errors; and
    wherein said second unit comprises means for detecting that no correctable burst error exists within a length of a received code and for providing the second decoding condition signal indicating whether a correctable burst error exists within the length of code.

9. An apparatus according to claim 1 wherein the third unit selects:
    the first output signal in response to an output signal from the first unit and second decoding condition signal indicating that there is an uncorrectable error;

the second output signal in response to an output signal from the second unit and a first decoding condition signal indicating that there is an uncorrectable error;

neither output signal in response to a signal from the first and second decoding condition signals indicating that there is an uncorrectable error in each unit.

10. An apparatus for decoding a received BCH code signal for correcting a combined complex error, the apparatus comprising:

a random error decoder for receiving the BCH code signal and for providing
 a first decoded output signal, and
 a first decoding condition signal;
a burst error decoder for receiving the BCH code signal and for providing
 a second decoded output signal, and
 a second decoding condition signal, the first and second decoding condition signal being indications of an error correction or an error detection; and
a selector including
 means for receiving the first and second decoded output signals and the first and second decoding condition signals from the decoders, and
 means for selecting one of the first and second decoded output signals based on the received signals, wherein the selecting means includes:
  means for comparing the first and second decoded output signals and for providing a combined decoded signal,
  switching means which receives the first and second decoded output signals and provides as an output one of the first and second decoded output signals, and
  a control circuit for receiving the combined decoded signal, the first decoding condition signal, and the second decoding condition signal, and for actuating the switching means.

11. The apparatus of claim 10 wherein the first and second decoded condition signals are signals which indicate the presence of an uncorrectable random error or burst error, respectively.

12. The apparatus of claim 11 wherein the means for selecting selects the first decoded signal in response to a first decoding signal and a second decoding condition signal indicating an uncorrectable burst error;

the second decoded signal in response to a second decoding signal and a first decoding condition signal indicating an uncorrectable random error; and neither decoded signal in response to first and second decoding condition signals indicating uncorrectable random and burst errors.

13. The apparatus of claim 10 wherein the random error decoder comprises:

means for providing a correction pulse,
means for delaying the received BCH code signal, and
means for combining the correction pulse and the delayed BCH signal to form the first decoded output signal.

14. The apparatus of claim 13 wherein the burst error decoder comprises:

means for providing an error pattern, means for delaying the received BCH code signal, and means for combining the error pattern and the delayed BCH signal to form the second decoded output signal.

15. The apparatus of claim 14 wherein the first and second decoded condition signals are signals which indicate the presence of an uncorrectable random error or burst error, respectively.

16. The apparatus of claim 10 wherein the means for comparing has means for determining whether the first and second decoded signals are identical to each other.

17. The apparatus of claim 16 wherein the control circuit determines whether there is an uncorrectable error in response to signals from the first and second signals indicating an uncorrectable error;

switches the switching means to the first decoded output in response to a second decoding condition signal indicating an uncorrectable error; and switches the switching means to the second decoded output in response to a first decoding condition signal indicating an uncorrectable error.

18. The apparatus of claim 10, wherein the control circuit has means for providing an output signal indicating an uncorrectable error when the first and second decoding condition signal each indicate that there is no uncorrectable signal, and when the combined decoded signal indicates that the first and second decoded signals are not identical.

19. The apparatus of claim 10 wherein the means for comparing includes an XOR logic element.

20. A method for providing a decoded output signal from an input signal, the method including the steps of:

receiving by a random error corrector the input signal and providing a first decoded output signal and a first decoding condition signal;

receiving by a burst error corrector the input signal and providing a second decoded output signal and a second decoding condition signal, wherein the random and burst error correctors correct errors in a different manner;

receiving, by a selector, the first and second decoded output signals and the first and second decoding condition signals provided by the random error corrector and the burst error corrector; and selecting one of the first and second decoded output signals in response to the signals received by the selector, wherein the selecting step includes:

selecting the first decoded output signal if the first decoding condition signal indicates a correctable output signal and the second decoding condition signal indicates an uncorrectable output signal; and selecting the second decoded output signal if the second decoding condition signal indicates a correctable output signal and the first decoding condition signal indicates an uncorrectable output signal.

21. The method of claim 20, wherein the receiving step includes the step of:

comparing the first and second decoded output signals to determine whether the first and second decoded output signals are identical.

22. The method of claim 21, wherein, in response to a determination that the first and second decoded output signals are identical, the selecting step includes:

selecting one of the first or second decoded output signal if the first and second decoding condition signals indicate that both of the first and second error correctors have correctable errors; and selecting neither of the first or second decoded output signal and providing an uncorrectable error output signal if the first and second decoding condition signals indicate that both of the first and second error correctors have uncorrectable errors.

* * * * *

UNITED STATES PATENT AND TRADEMARK OFFICE
CERTIFICATE OF CORRECTION

PATENT NO. : 5,420,873
DATED : May 30, 1995
INVENTOR(S) : Atsuhiro Yamagishi, et al It is certified that error appears in the above-indentified patent and that said Letters Patent is hereby corrected as shown below:

On the Title page, item [30], Foreign Application Priority data

May 15, 1989 [JP] Japan   121909/1989 --

Signed and Sealed this

Tenth Day of October, 1995

Attest:

BRUCE LEHMAN

Attesting Officer

Commissioner of Patents and Trademarks